United States Patent

Herkel et al.

[11] Patent Number: 5,765,664
[45] Date of Patent: Jun. 16, 1998

[54] ELEVATOR DRIVE FAULT DETECTOR

[75] Inventors: Peter Herkel; Gunter Blechschmidt; Wolfgang Zemke, all of Berlin, Germany

[73] Assignee: Otis Elevator Company, Farmington, Conn.

[21] Appl. No.: 791,693

[22] Filed: Jan. 30, 1997

Related U.S. Application Data

[63] Continuation of Ser. No. 538,997, Oct. 5, 1995, abandoned.

[51] Int. Cl.[6] .................................................... B66B 1/34
[52] U.S. Cl. .................... 187/393; 187/277; 187/391; 361/31
[58] Field of Search ................................ 187/289, 277, 187/393, 391; 318/801; 361/31

[56] References Cited

U.S. PATENT DOCUMENTS

| | | | |
|---|---|---|---|
| 4,263,987 | 4/1981 | Satoh et al. | 187/29 R |
| 4,506,766 | 3/1985 | Watanabe | 187/29 R |
| 4,898,263 | 2/1990 | Manske et al. | 187/133 |
| 5,241,255 | 8/1993 | Oshima et al. | 318/801 |
| 5,243,291 | 9/1993 | Umemura | 324/418 |
| 5,276,292 | 1/1994 | Goto et al. | 187/108 |

OTHER PUBLICATIONS

European Elevator Code (EN81-1) chapter 12.7.3.

*Primary Examiner*—Robert Nappi

[57] ABSTRACT

An elevator drive fault detector for detecting operational faults in an elevator drive having an inverter and only one circuit breaker includes a current sensor, a monitoring device, a control device and an operational control system. The current sensor provides a current sensor signal. The monitoring device determines if an operational fault exists in response to the current sensor signal and provides an operational signal. The monitoring device disables the operational signal if the monitoring device determines that an operational fault exists or if the elevator drive fault detector performs a system check operation. The operational control system provides both the run command and an operational check signal and is responsive to the operational signal such that if the operational signal is disabled then the operational control system opens the one circuit breaker and disables the run command such that the control device disables a PWM signal. If the operational signal was disabled during a system check operation then the operational control provides the operational check signal to the monitoring device such that if the monitoring device does not receive the operational check signal within a predetermined time then the monitoring device continues to disable the operational signal and the drive is elevator shutdown.

6 Claims, 2 Drawing Sheets

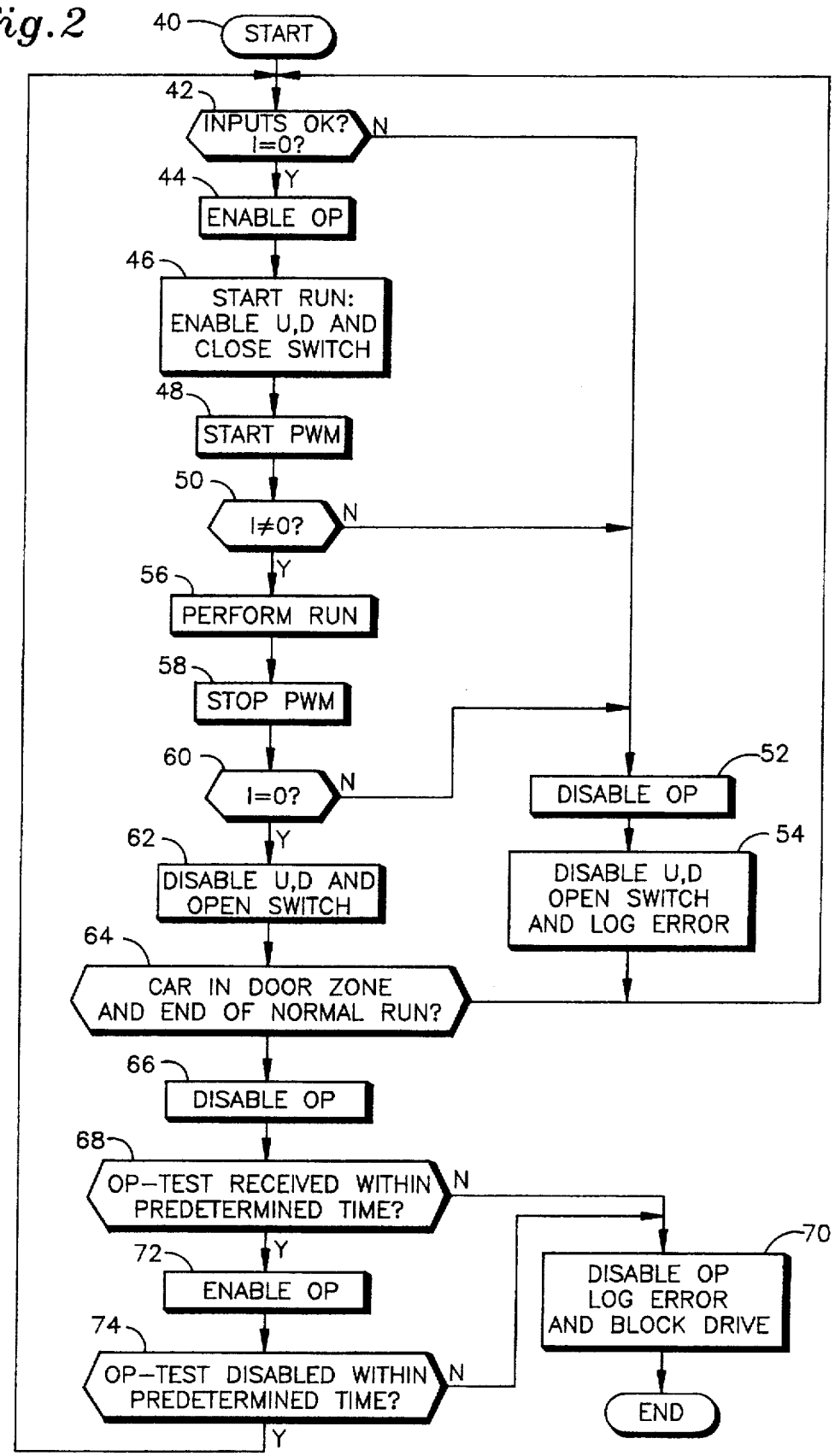

ELEVATOR DRIVE FAULT DETECTOR

This is a file wrapper continuation of application Ser No. 8/538,997 filed Oct. 5, 1995, now abandoned.

TECHNICAL FIELD

The present invention relates generally to elevators and, in particular, relates to elevator drive fault detection.

BACKGROUND OF THE INVENTION

Variable frequency elevator drives are used to supply elevator motors with a variable voltage so as to provide an elevator system with variable motor speeds. These drives typically include a rectifier, a DC-link, an inverter, a pulse width modulator and two independent switches for interrupting a current to the motor.

The elevator drives must comply with certain safety codes in order to ensure that industry safety standards are achieved. One such safety code is the EN81-1. To fulfill the requirements described in EN81-1 chapter 12.7.3, the elevator drive must include a means for ensuring that the current is interrupted while the elevator is stationary or during a normal stopping period.

The conventional means to fulfill the requirements in EN81-1 includes at least two independent switches that are commanded open while the elevator is stationary and during a normal stopping period. These switches are normally placed between a power source and the rectifier. However, this method requires at least two switches which are expensive and necessitates the use of additional space inside the elevator drive.

DISCLOSURE OF THE INVENTION

It is an object of the present invention is to provide a cost effective means of interrupting the current flow to the drive which does not result in a loss of safety of the elevator drive.

It is another object of the present invention to provide a cost effective fault detection system without a loss in safety of the elevator drive.

According to the present invention, an elevator drive fault detector for detecting operational faults in an elevator drive having an inverter and a circuit breaker includes a current sensor, a monitoring device, a control device and an operational control system.

In one particular embodiment, the present invention operates as follows. The current sensor provides a current sensor signal indicative of an input current of the inverter. The monitoring device determines if an operational fault exists in response to the current sensor signal and provides an operational signal. The monitoring device disables the operational signal if the monitoring device determines that an operational fault exists or if the elevator drive fault detector performs a system check operation.

The operational control system controls the circuit breaker and provides both a run command and an operational check signal. The control device controls a PWM signal to the inverter in response to the run command. The operational control system is responsive to the operational signal such that if the operational signal is disabled then the operational control system opens the circuit breaker so that electric power to the motor is disconnected and disables the run command so that the control device disables the PWM signal.

If the operational signal was disabled during a system check operation then the operational control provides the operational check signal to the monitoring device. If the monitoring device does not receive the operational check signal within a predetermined time then the monitoring device continues to disable the operational signal and the elevator drive is shutdown.

Thus, the present invention provides an apparatus and method that includes the advantage of reducing the number of circuit breakers without a loss in safely while maintaining compliance with the EN81-1 safety code.

BRIEF DESCRIPTION OF THE DRAWINGS

FIG. 2 is a flow diagram of a method according to the present invention.

BEST MODE FOR CARRYING OUT THE INVENTION

Figure 1:
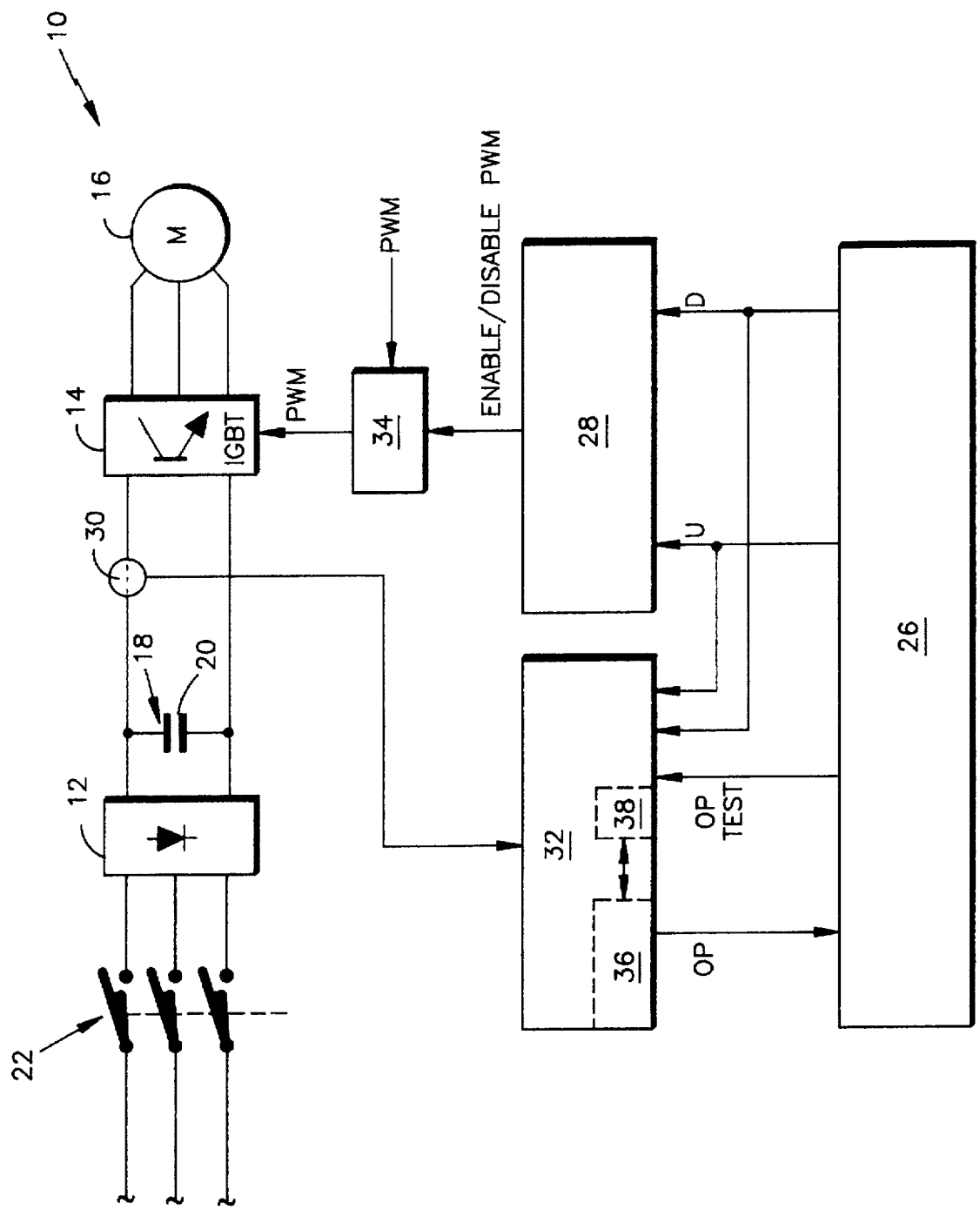
FIG. 1 is a functional block diagram of a preferred embodiment of an elevator drive incorporating the principles of the present invention.

Referring now to the drawings, in particular to FIG. 1, the preferred embodiment of a motor drive 10, according to the present invention, has a three phase alternating current (AC) rectifier 12 which is of per se well known construction. As is well known, the rectifier 12 is connected to a power source so as to receive therefrom three phase alternating current R, S, T, and rectifies or converts the received three phase alternating current into direct current (DC). The rectifier 12 thus has a pair of DC terminals connected to DC terminals of an inverter 14. As is well known, the inverter 14 is designed to convert DC received from the rectifier 12 into three phase alternating current which is supplied to an electric motor 16, such as an induction motor. The inverter 14, in a preferred embodiment, includes IGBTs configured in a known fashion. As is also well known, the three phase alternating current supplied by the inverter 14 is controlled by a pulse width modulator (not shown) of a known construction. A DC Link 18 having a smoothing capacitor 20 is connected across the DC terminals of the inverter 14. Additionally, according to the present invention, a circuit breaker 22 is electrically connected between the power source and the rectifier 12 so that the electric current to the drive 10 can be controlled by an elevator drive fault detector as is described hereinbelow.

The elevator drive fault detector includes an operational control system 26, a control device 28, a current sensor 30, and a monitoring device 32.

The operational control system 26 controls the operation of the elevator system, as is well known in the art, and is embodied in the elevator controller (not shown). Run commands U, D are provided to the elevator drive 10 by the operational control system 26 for causing an elevator car (not shown) to move in either the up or down direction respectively. The run commands U, D are also provided to the control device 28 and the monitoring device 32 for use in fault detection as is explained in detail hereinbelow.

A pulse width modulation signal ("PWM"), provided by the pulse width modulator (not shown), controls the three phase alternating current supplied by the inverter 14 to the motor 16 as is known in the art. The control device 28 controls the PWM signal in response to the run commands U, D. For example, if the operational control system 26 provides either a U or D run command then the control device 28 enables the PWM signal so that the signal may be received by the inverter 14. Alternatively, if a U or D run command is not provided by the operational control system 26 then the control device 28 disables the PWM signal such that the PWM signal is not received by the inverter 14. The operation of the motor 16 is suspended if the inverter 14 does not receive the PWM signal.

In a particular embodiment, the control device 28 is realized by a logic circuit comprising an OR gate having run commands U, D as inputs and an Enable/Disable PWM signal as an output for controlling the PWM signal to the inverter 14. A driver 34 responsive to the Enable/Disable PWM signal and the PWM signal provides the PWM signal to the inverter 14 if the driver 34 is enabled by the Enable/Disable PWM signal.

The current sensor 30 is of per se known construction and is electrically connected to the DC input terminal of the inverter 14 so that an input current provided to the inverter 14 can be monitored. The current sensor 30 is also electrically connected to the monitoring device 32 for providing a current sensor signal to the monitoring device 32 in response to the input current of the inverter 14.

The monitoring device 32, according to a preferred embodiment of the present invention, comprises a microprocessor 36 having a memory 38 and is used to verify blocking of current flow to the motor 16. Programming is embedded, in a conventional manner, in the memory 38 for causing the monitoring device 32 to verify blocking of current flow to the motor 16 as is described hereinbelow. The monitoring device 32 receives the current signal provided by the current sensor 30 so that the monitoring device 32 is provided with input current information of the inverter 14. The operational control system 26 is also electrically connected to the monitoring device 32 for the transmission of signals U, D, OP, OP TEST, used in fault detection as is explained in detail below.

In operation, referring to FIG. 2, the present invention provides fault detection of a motor drive 10 beginning at step 40 labeled start. The monitoring device 32, in the first step 42 performed, determines if the current sensor signal has a value of zero and if other input signals are within normal parameters. The other input signals include the run commands U, D and the DC voltage across the DC input terminal of the inverter 14. The run commands U, D should only be enabled during a run and the DC voltage should be within a predetermined voltage range depending on the specific design of the drive 10. The current sensor signal having a value of zero indicates that the input current of the inverter 14 is zero; thus, the drive 10 is not providing power to the elevator system and the elevator car is stationary.

If either the current sensor signal does not have a value of zero or if the input signals are not within normal operating parameters then the monitoring device disables an operational signal OP in step 52. An enabled operational signal OP indicates to the operational control system 26 that the elevator drive 10 is operating properly. A disabled operational signal OP indicates that a fault is detected. In response to the disabled operational signal OP, the operational control system 26, in step 54, opens the circuit breaker 22, disables the run command U, D and logs an error.

If, however, the current sensor signal has a value of zero and the other input signals are within normal operating parameters then the monitoring device 32 enables the operational signal OP to the operational control system 26 in step 44. In response to the operational signal OP, the operational control system 26 closes the circuit breaker 22 and provides a run command U, D to the control device 28. Thus, the elevator drive fault detector allows the elevator system to start an elevator run. The run is defined as movement of an elevator car from one landing to another landing. For example, the run may move the elevator car from a lobby to a top floor.

The PWM signal is provided to the inverter 14 in step 48. In step 50, the current sensor signal is analyzed to determine if a drive fault exists. The monitoring device 32 determines whether a fault exists by evaluating the current sensor signal and the run signals U, D. For example, if the current sensor signal indicates that current is not being supplied to the motor 16 and a run signal U, D is present then it is determined that a drive fault exists. Accordingly, in step 50, the current sensor signal should have a value other than zero; indicating that current is being supplied to the inverter 14. Thus, the value of the current sensor signal is checked and if the current sensor signal has a value of zero then it is determined that a fault exists and the monitoring device 32 in step 52 disables the operational signal OP. Consequently, the operational control system 26, in step 54, opens the circuit breaker 22, disables the run command U, D and logs an error. If the current sensor signal has a value other than zero then the operational control system 26 performs an elevator run in step 56.

At the end of the run, the PWM signal is stopped in step 58. Next, the current sensor signal is again checked by the monitoring device 32 in step 60. Here, the current sensor signal should have a value of zero. If the current sensor signal does not have a value of zero after the PWM signal is stopped then it is determined that a fault exists and the monitoring device 32 disables the operational signal OP in step 52. In response, the operational control system 26 opens the circuit breaker 22, disables the run command U, D and logs an error in step 54.

If, in step 60, the elevator drive fault detector determines that a fault does not exist then the operational control system 26 disables the run signal U, D and opens the circuit breaker 22 in step 62. Next, the operational control system 26 performs a system check operation for checking the integrity of the operational signal OP. The procedure is performed by disabling the operational signal at the end of a normal run to analyze the response of the elevator drive fault detector under simulated fault conditions. For example, in step 64, the operation control system determines if the elevator car is within a door zone and has finished a normal run. If the elevator car is not within a door zone or has not finished a normal run then the elevator drive fault detector returns to step 42 to resume normal operation and continue elevator drive fault detection.

However, if it is determined in step 64 that the elevator car is within a door zone and has finished a normal run then the operational control system 26 simulates a drive fault condition as follows. The monitoring device 32, in step 66, disables the operational signal OP and waits for a predetermined time to receive an operational test signal OP TEST that is enabled by the operational control system 26 in response to the disabled operational signal OP. In a preferred embodiment, the predetermined time is 0.5 seconds. The predetermined time was chosen to minimize the possibility that another fault could enable the operational test signal OP TEST during the waiting time such that the elevator drive fault detector allows the elevator system to perform a run under fault conditions. In other words, the predetermined time is chosen to detect a first fault before a second fault can occur.

If the monitoring device 32 does not receive the operational test signal OP TEST within the predetermined time then it is determined that an error has occurred in the elevator drive fault detector. Accordingly, the monitoring device 32 maintains the operational signal OP disabled and the operational control system 26 disables the run signals U, D and logs an error in step 70. As a consequence, current flow to the motor 16 is blocked and the drive 10 is shutdown.

Alternatively, if the enabled operational test signal OP TEST is detected by the monitoring device 32 within the predetermined time in response to the disabled operational signal OP then the monitoring device 32 enables the operational signal OP in step 72. In response to the enabled operational signal, the operational control system 26 should disable the operational test signal OP TEST. Accordingly, in step 74, the monitoring device 32 determines if the operational test signal OP TEST has been disabled within the predetermined time. If the operation test signal OP TEST has not been disabled within the predetermined time then the monitoring device 32 disables the operational signal OP and the operational control system 26 disables the run signals U, D and logs an error. As a consequence, current flow to the motor 16 is blocked and the drive 10 is shutdown.

However, if the operational test signal OP TEST is disabled within the predetermined time then it is determined that the elevator drive fault detector is operating properly and resumes normal operation by returning to step 42.

Thus, the present invention provides the advantage of reducing the number of circuit breakers without a loss in safely while maintaining compliance with the EN81-1 safety code.

Various changes to the above description may be made without departing from the spirit and scope of the present invention as would be obvious to one of ordinary skill in the art of the present invention.

What is claimed is:

1. An elevator drive fault detector for detecting faults in an elevator drive having an inverter and a circuit breaker, said elevator drive fault detector comprising:

a current sensor for providing a current sensor signal indicative of an input current of the inverter;

a monitoring device for determining if a fault exists in response to the current sensor signal and for providing an operational signal, said monitoring device disables the operational signal if said monitoring device determines that a fault exists or if said elevator drive fault detector performs a system check operation;

a control device for controlling a PWM signal to the inverter in response to a run command; and an operational control system for providing the run command and for controlling the circuit breaker in response to the operational signal such that if the operational signal is disabled said operational control system opens the circuit breaker and disables the run command so that electric power to the motor is interrupted and the elevator drive is shutdown.

2. The elevator drive fault detector as recited in claim 1 wherein said control device disables the PWM signal in response to the disabled run command.

3. The elevator drive fault detector as recited in claim 1 wherein if the operational signal was disabled during the system check operation then said operational control provides an operational check signal to said monitoring device such that if said monitoring device does not receive the operational check signal within a predetermined time then said monitoring device continues to disable the operational signal and the drive is elevator shutdown.

4. The elevator drive fault detector as recited in claim 3 wherein said control device disables the PWM signal in response to the disabled run command.

5. A method for fault detection of an elevator drive having a circuit breaker, said method comprising the steps of:

providing a current signal to a monitoring device, the current signal being indicative of an input current of an inverter of the elevator drive;

providing an operational signal to an operation control system in response to the current signal, the operational signal being indicative of a normal operating condition;

determining if a fault exists based upon the current signal;

disabling the operational signal in response to determining that a fault exists in said determining step;

opening the circuit breaker in response to said disabling step;

disabling the operational signal during a system check operation;

checking for an operational check signal provided by the operational control system in response to the disabling step;

enabling the operational signal in response receiving the operational check signal;

resuming normal operation in response to receiving the operation check signal; and performing a drive shutdown in response to not receiving the operation check signal.

6. A method for determining the integrity of an elevator drive fault protection device of an elevator drive having a circuit breaker, said method comprising the steps of:

providing a current signal to a monitoring device, the current signal being indicative of an input current of an inverter of the elevator drive;

providing an operational signal to an operation control system in response to the current signal, an enabled operational signal being indicative of a normal operating condition and a disabled operational signal being indicative of a fault condition;

disabling the operational signal during a system check operation;

waiting for an operational check signal provided by the operational control system to the monitoring device in response to said disabling the operational signal step;

enabling the operational signal in response to the operational check signal provided by the operational control system; and performing a drive shutdown in response to not receiving the operation check signal, wherein said shutdown includes maintaining the operational signal disabled and opening the circuit breaker of the elevator drive.

* * * * *